United States Patent [19]

Sachs

[11] Patent Number: 4,670,833
[45] Date of Patent: Jun. 2, 1987

[54] SEMICONDUCTOR MODULE FOR A HIGH-SPEED SWITCHING ARRANGEMENT

[75] Inventor: Klaus Sachs, Osterode/Harz, Fed. Rep. of Germany

[73] Assignee: Anton Piller GmbH & Co. KG, Osterode/Harz, Fed. Rep. of Germany

[21] Appl. No.: 740,871

[22] Filed: Jun. 3, 1985

[30] Foreign Application Priority Data

Jun. 1, 1984 [DE] Fed. Rep. of Germany ....... 3420535

[51] Int. Cl.⁴ .......................................... H02M 7/538
[52] U.S. Cl. ..................................... 363/132; 363/17; 363/147; 361/386; 361/414
[58] Field of Search ..................... 363/15, 16, 17, 124, 363/131, 132, 147; 361/56, 91, 111, 386, 414

[56] References Cited

U.S. PATENT DOCUMENTS 4,449,292  5/1984  Kaufman .............................. 361/386
4,498,122  2/1985  Rainal ................................. 361/414

FOREIGN PATENT DOCUMENTS 3201296  7/1983  Fed. Rep. of Germany .
2015291  9/1979  United Kingdom .

*Primary Examiner*—Patrick R. Salce
*Assistant Examiner*—Anita M. Ault
*Attorney, Agent, or Firm*—Gottlieb, Rackman & Reisman

[57] ABSTRACT

Electric semiconductor switching module for a switching arrangement with switching times of the order of magnitude of 100 ns and large currents. The switching arrangement features a parallel connection of active semiconductor switching elements and freewheel diodes, which are each arranged in direct proximity, and having a load connection of the semiconductor switching elements and freewheel diodes such that current flows in the same direction relative to the load connection through the semiconductor switching elements and the freewheel diodes. The connections for the direct current voltage source are designed with spatially closely adjacent conductors, in particular two conductor layers separated by an insulating layer. The conductors are arranged in direct proximity to the semiconductor switching elements and the freewheel diodes and the terminals of the semiconductor switching elements and the freewheel diodes are connected conductively with the conductors in such a way that current always flows through them in the same direction. It is also advisable that at least one smoothing capacitor is arranged directly on the switching module.

20 Claims, 14 Drawing Figures

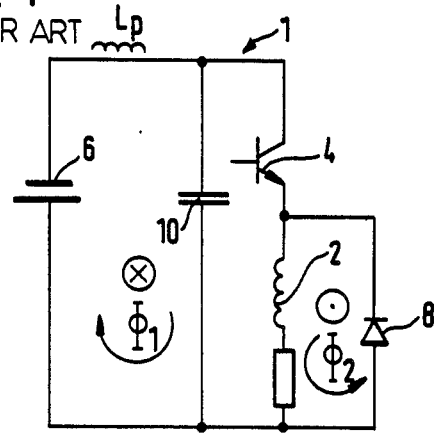
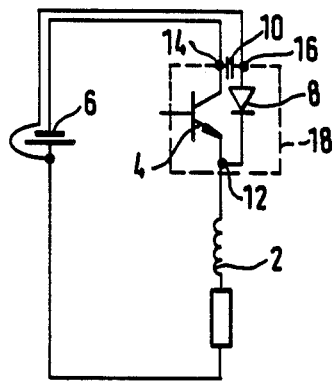
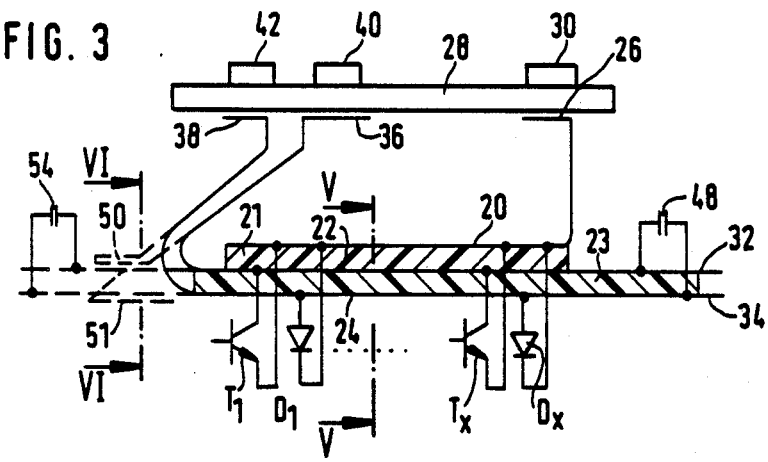
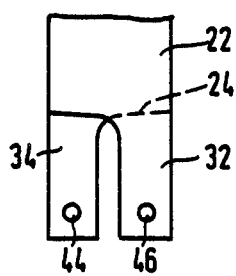
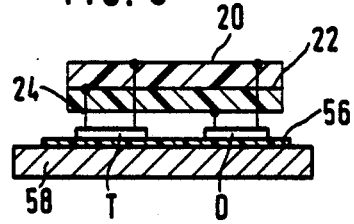
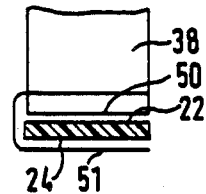

SEMICONDUCTOR MODULE FOR A HIGH-SPEED SWITCHING ARRANGEMENT

BACKGROUND OF THE INVENTION

The invention relates to a semiconductor module for a high-speed switching arrangement, the module having an active semiconductor switching element and a freewheel diode arranged in direct proximity, with a common load connection for the semiconductor switching element and the freewheel diode such that current flows in the same direction relative to the common load connection through the semiconductor switching element and the freewheel diode from a direct current voltage source, which is connected to the respective remaining connections of the semiconductor switching element and the freewheel diode.

DESCRIPTION OF THE PRIOR ART

Semiconductor modules of this kind (GB No. 2 015 291) are used for example as so-called "choppers" for producing a variable direct current voltage from a steady voltage source. In this case, the semiconductor switching element lies in series with the load and is periodically switched on and off. The intensity of the output voltage results, in the case of constant input voltage, from the ratio of turn-on time to turn-off time.

In the case of an inductive load, the load current driven by the inductance is fed through the freewheel diode during the turn-off time. The current therefore flows in the electrical circuit formed by the load and the freewheel diode. The current driven by the stored magnetic energy decays with the time constant L/R.

In such a circuit, the current flows during the turn-on time in the conductor loop, which is formed by the voltage source, the load and the semiconductor switching element, and passes over in the turn-off time into the conductor loop which is formed by the load and the freewheel diode. Since both conductor loops form inductances, transient voltages appear in the case of the turn-off, which are dangerously high, especially in the case of high-speed switches, and which can damage the semiconductor switching elements.

For protecting the semiconductor switching elements against transient voltages, there is known a plurality of so-called snubber circuits (DE-OS No. 32 01 296) which convert the energy stored in the parasitic loop inductance. This results in losses and in additional parasitic inductance.

In another prior art arrangement, a smoothing capacitor is connected in the first conductor loop in parallel to the circuit formed by the semiconductor switching element and the load. This receives the energy stored in the parasitic loop inductance virually without loss and this is lost to the load during the turn-on time.

It is furthermore known in a semiconductor switching arrangement comprising a plurality of semiconductor switching elements to connect said semiconductor switching elements parallely to conductor plates positioned one above the other and being separated by an insulating layer. Current is flowing in opposite directions through the conductor plates, so that the conductor inductances decrease (DE-OS No. 32 01 296).

Transient voltage problems, which cannot be solved using the known means, occur when extremely short switching times, e.g. switching times of the order of 100 ns, are required for the semiconductor switching device in the case of high switching currents, e.g., of the order of 100 A. Switching times of 100 ns are around one order of magnitude lower than the previously normal switching times of the order of magnitude 1 $\mu$s.

The object of the invention is to create a semiconductor module, for a switching arrangement for high switching frequencies having extremely short switching times, which is successful in avoiding transient voltages without the need for additional circuitry.

SUMMARY OF THE INVENTION

Based on a semiconductor module of the type concerned this problem is solved in that each of the remaining connections of the semiconductor switching element and freewheel diode is connected with one of two conducting layers separated by an insulating layer and which are arranged in direct proximity to the semiconductor switching element and the freewheel diode and through which the load current flows in the same direction relative to the load.

Suitable embodiments of the invention are described hereinafter and are the subject of the claims.

BRIEF DESCRIPTION OF THE DRAWINGS

The invention is illustrated by way of example in the drawings and is subsequently described in detail with the aid of the drawings, in which:

FIG. 1 shows a known chopper circuit.

FIG. 2 shows the same circuit in a design according to the invention.

FIG. 3 shows a schematic side view of the design of a transistor switch according to the invention.

FIG. 4 shows a top view of detail of the switch according to FIG. 3, this being the connection for a smoothing capacitor.

FIG. 5 shows schematically a section along the line V—V in FIG. 3.

FIG. 6 shows a section along the line VI—VI in FIG. 3.

DESCRIPTION OF THE PREFERRED EMBODIMENTS

Figure 7:
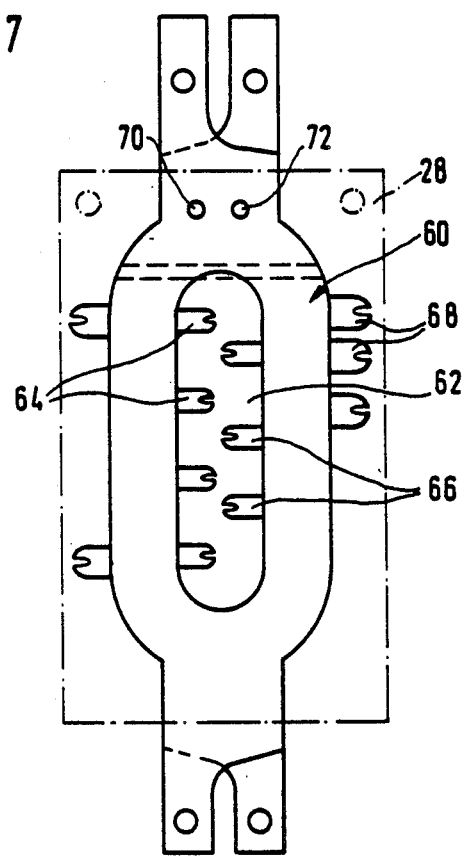
FIG. 7 shows a top view of a conductor design for a switching arrangement according to FIG. 3.

The known switching circuit according to FIG. 1 includes an inductive load 2, which is arranged in series with a switching transistor 4, by which the load is periodically supplied with current from a voltage source 6. A freewheel diode 8 is arranged in parallel to the load 2. The freewheel diode is designed for mainly the same capacity as the transistor. Given a through-connected transistor 4, a flux $\Phi_1$ occurs which emerges downwards from the conductor loop plane formed by the transistor 4, the load 2 and the voltage source 6, as indicated by the arrow. This circuit has a parasitic inductance $L_p$. If the transistor 4 is blocked then a flux $\Phi_2$ is produced by the inductance of the load 2, which emerges from the conductor loop plane formed by the load 2 and the freewheel diode 8, as indicated by the arrow. Should the transistor 4 be switched off then a current is driven through the first conductor circuit by the loop inductance and produces a voltage across the transistor 4. This voltage is given by the formula:

$$U_S = L \cdot \frac{di}{dt}$$

Experience has shown that the inductive components of the system plus lead inductance plus wiring inductances are of the order of between 25 µH and 100 µH.

If a current of 5 A is switched off in 1 µs there results in such an inductance a transient voltage of $$U_S = 100 \, (\mu H) \cdot \frac{5(A)}{\mu s} = 500 \text{ V}$$

This voltage, which exceeds the permissible transient voltage for a transistor, is limited in that a smoothing capacitor 10 is connected in the conductor circuit 1 in parallel to the load 2 and to the transistor 4. By means of this smoothing capacitor, the conductor loop effective for the commutating process is reduced to the loop formed by the smoothing capacitor 10, the transistor 4 and the load 2. The inductance present in the breaking circuit is thereby reduced by around one order of magnitude to between around 2.5 µH. The transient voltage which is to be expected is between 12.5 V and 50 V, given such conditions.

The possibility of protecting the transistor by means of such a smoothing capacitor is limited on the one hand by the currents to be switched from the transistor and on the other hand by the switching time. If the current to be switched is increased to 100 A, there results a transient voltage of maximum 1000 V, taking as a basis the other parameters. Should the switching time be further reduced by one order of magnitude to 100 ns for example in the case of such a current intensity, then there results a transient voltage of maximum 10,000 V. In neither case is it possible any longer to limit the transient voltage at the transistor by means of a smoothing capacitor in the manner described according to FIG. 1.

FIG. 2 shows a circuit, in accordance with the invention, where in the case of high currents, such as for example, of the specified order of 100 A and switching times of the order of 100 ns, the appearance of extreme transient voltages is avoided. In the case of the embodiment according to FIG. 2 the same conductor circuits are provided in principle as in the case of the circuit shown in FIG. 1. The difference in this case is that the transistor 4 and the freewheel diode 8, through which the current flows in the same direction relative to the mutual connection 12 to the load—load point—, are arranged in direct proximity to each other, as is shown by the Box 18 indicated by the broken lines. In this way, there is a very close magnetic coupling of the current-carrying conductors of the transistor and the freewheel diode 8. The conductor loop comprising the voltage source 6, the transistor 4 and the load 2 can now be conceived as a constituent part of the load inductance. For the switching operation, only the inductance from the conductor loop formed by the voltage source 6, the transistor 4 and the freewheel diode 8 is effective. The inductance can still be further reduced if the smoothing capacitor 10 is connected directly between the connections 14 and 16 of the module 18 formed by the transistor 4 and the freewheel diode 2. The two conductors leading to the voltage source 6 are, as indicated in the drawing by the close parallel lines, guided as closely together as possible and are therefore magnetically closely coupled. The effective inductance can therefore be reduced to the order of 10 nH. Even in the case of extremely short switching times referred to, there result transient voltages which again can be limited in the usual way by means of a simple smoothing capacitor. If the inductance of the smoothing capacitor is included then an overall inductance as low as 20 nH can be attained, which limits the transient voltage to about 20 V for a current of 100 A to be switched in 100 ns.

The closest parallel guide and magnetic coupling can be achieved if the transistor 4 and the freewheel diode 8 are arranged on a single chip. Several transistors and freewheel diodes can each be arranged alongside each other on one chip. Such a parallel connection is generally required whenever high currents are to be switched. The requirements can however also be accommodated to a sufficient degree in that the transistors and the freewheel diodes on a number of chips are arranged alternately alongside each other on a common base plate serving as a thermal sink, wherein it is also possible to arrange discrete transistors and freewheel diodes in two separates rows. It is of particular advantage if the semiconductor elements are so applied as to be insulated against a common base plate, which can, for example, be achieved by the use of insulating layers with good thermal conducting properties such as beryllium oxide or aluminum oxide. An extremely low-inductance, high-speed switch for inductive loads is shown schematically in FIG. 3. In order to keep the inductance of the conductors as low as possible, the conductors in the area of the connections of the transistors and freewheel diodes are designed in the form of a stack of three thin conducting layers separated by insulating layers. The conductor layers are preferably in the form of strips and might for example consist of sheet copper. Three conductor layers 20, 22, 24, shown in FIG. 3, are separated from one another by insulating layers 21, 23, which are shown in the drawing with exaggerated thickness. The design of these insulating layers should be as thin as possible. The upper conductor layer 20 is the load connection. This conductor layer is made squared at one end wherein the squared section can form a tag 26, which can for example lie adjacent the underside of a connection bearing plate 28 made from an insulating material and which is connected by means of a screw (not shown) with a terminal 30 on the plate 28.

The lower conductor layers 22 and 24 are connected with the direct current voltage source. Both conductors are turned upwards at their lefthand ends and are guided upwards, each in the same way lying beneath and adjacent the plate 28 at their ends by means of straps 36, 38 and being connected with the terminals 40, 42 on the upper side of the plate 28 by means of screws (not shown). The load connections of the transistors $T_1 - T_x$ and the freewheel diodes $D_1 - D_x$, an appropriate number of which are arranged alongside each other in the system, are connected to the conductor layer 20. The transistors $T_1 - T_x$ are also connected to the conductor strip 22 on the drain or collector side, while the freewheel diodes $D_1 - D_x$ are connected to the conductor layer 24 at their second pole.

As has already been mentioned, the individual conductor layers 20, 22, 24 can consist of sheet strips. For the connection of a smoothing capacitor both conductor layers 22 and 24, which are connected to the voltage source, can be extended at one end, on the right hand side for example in the case of the embodiment, in the illustrated form of individual tags 32, 34. A conductor lug arrangement of this kind is shown in plan view in FIG. 4. In this case, by way of example, the width of the conductor lugs is somewhat less than half the width of the conductor layers. The adjacent tags 32, 34 can be bent into the same plane. They are provided with connection holes 4, 46, through which the connecting screws of a smoothing capacitor can be passed. In this way the smoothing capacitor 48 is electrically connected and is also supported mechanically. Such a supported capacitor 48 should be as close as possible to the free connections 32, 34 directed away from the load of the transistors and the freeweel diodes so that a conductor loop of low inductance is achieved. Corresponding tags can be provided at the opposite end S of the conductor layers. The two conductor layers 22, 24 can then be extended accordingly. A tag 50 which leads to the connection 40 can, as is shown by the broken lines, be attached by the end facing the conductor layers in electrically conductive manner on the upper side of the conductor layer 22 (see also FIG. 6). A tag 51, which leads to the terminal 42, can be provided with an extension which laterally takes in the conductor layers 22 and 24 and which can then be attached in an electrically conductive manner to the underside of the conductor layer 24 (see also FIG. 6). An additional smoothing capacitor 54 can be arranged on the conductor tags which are brought out to the left as illustrated.

The tags at the two ends of the conductor layers 22 and 24 can also serve as direct connections to the voltage source. In this case, the tags leading upward to the terminals 40 and 42 would not be used.

As can be seen from FIG. 5, the chips with the freewheel diodes D and with the transistors T are attached to a substrate plate 56 and together with said substrate plate mounted on a metal plate 58 operating as a thermal sink. In this arrangement, a number of transistors lie in a line and parallel thereto there is a line of freewheel diodes. FIG. 5 also shows schematically how the freewheel diodes and the transistors are connected with the conductor layers 20, 22 and 24.

A switch as shown schematically in FIG. 3 and as has already been described, can be designed to have a total inductance of 20 nH or less including the inductance of a smoothing capacitor.

The bond wires of the transistors and the freewheel diodes can be connected directly to the appropriate conductor layers. In this case it is advisable to provide protruding connecting elements on the conductor layers, and thus, by way of example, on the sheet strips which form the conductor layers. The tags can also be arranged on both longidutinal edges. Another possibility is to provide the conductor layers with a longitudinal slot in the centre thereof, as is illustrated by way of example in FIG. 7. The conductor layers 60 are here provided at their centre in the region of the transistors and the freewheel diodes with a longitudinal aperture 62 into which connecting elements 64, 66 protrude from two of the conductor layers. Connecting elements 68 are provided at the third conductor layer. If the outward facing connecting elements are arranged at the conductor layer forming the load connection in the case of a chip arrangement according to FIG. 5, then it might be advisable to also provide corresponding tags on the opposite side so that certain connecting elements are available for the bond wires of the silicon chips and the transistor chips, whereby assembly can be facilitated.

As is shown in FIG. 7, holes 70, 72 can be provided in the conductor layers through which conductors can be passed for the control terminals of the transistors.

In principle, normal fast-operating switching transistors can be provided as switches of the type described. It is however, preferable that field-effect transistors (FET's) are used.

As described hereinbefore, the conductor layers can comprise sheet strips with intermediate insulation. It is also possible to design the conductor layers as in a multi-layer circuit board. The important point is that the conductor loop with the conductor layers, to which the transistors and diodes respectively are connected with their connections opposed to the common connection to the load has to have as low an inductance as possible for which purpose these conductor layers are as close together as possible. The position of the conductor layer 20 forming the load connection is not critical. It may be positioned at a greater distance to the conductor layers 22 and 24 and does not have to be arranged necessarily parallel thereto. Between the conductor layer 22 and the load connection can for instance be provided a further conductor layer with the control connections for the transistors. Above this further conductor layer the load conductor can be arranged at a distance.

Figure 8:
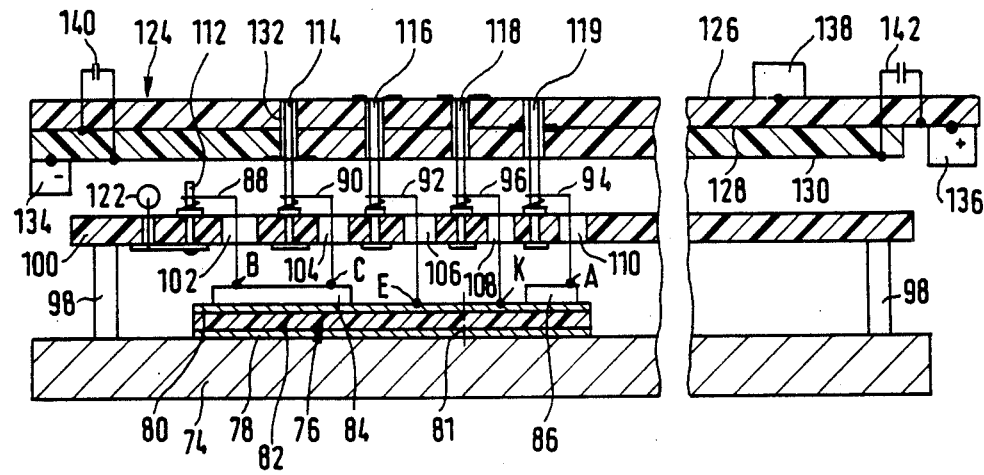
FIG. 8 shows a side view of a semiconductor module.
Figure 9:
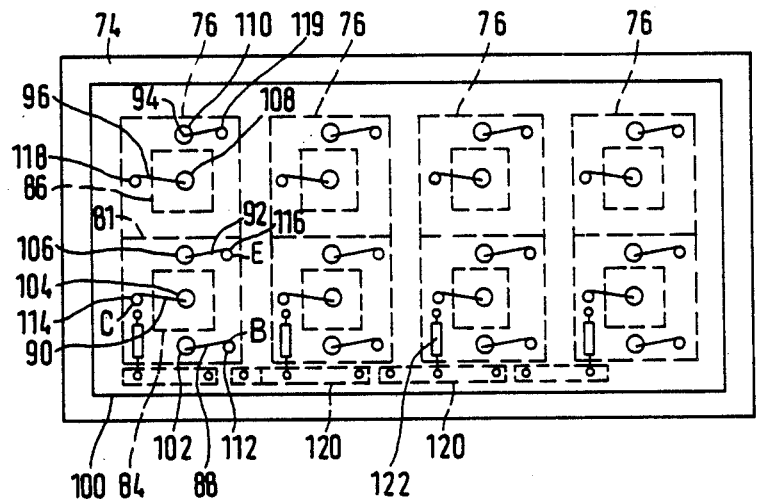
FIG. 9 shows a top view of the multiple semiconductor module shown in FIG. 8.

FIGS. 8 and 9 show schematically a semiconductor module having a number of transistors and freewheel diodes. On a copper plate 74, serving as a thermal sink, there are a number of chip supporting plates 76. These plates comprise an aluminum oxide plate 82 lined on each side with a copper coating 78, 80. The chip supporting plates 76 are soldered by the copper coating 78 to the thermal sink 74. On the upper copper coating 80 at least one transistor chip 84 and one freewheel diode chip 86, and for preference a plurality of them, are soldered. Such a number of transistors and freewheel diodes is hereinafter referred to as basic module.

The transistors and/or freewheel diodes of a basic module can also be arranged on more than one chip support. The copper coating 80 is therefore the common connection point of the transistors and the freewheel diodes. The individual connections for the base B, the collector C and the emitter E of the transistor are connected with bond wires 88, 90, 92 and the second connection of the freewheel diode 86 with a bond wire 94. Insofar as it is subject to alteration whether the freewheel diode should be connected with the common load point by its anode or its cathode, the copper coating 80 can be separated between the transistor chip 84 and the freewheel diode chip 86, as is indicated in FIG. 8 by the dash-line 81. A further bond wire 96 has then to be provided for the freewheel diode chip 86.

Since the bond wires, which are made for example of aluminium, only have a minimal rigidity, it is advisable to connect them with rigid connections, such as terminal pins, for example, via which the connections to the conductor layers are established. The connections which are to be connected with the copper coating 80 can be soldered to this and also given a rigid design.

FIG. 8 shows one chip support with one transistor chip and one freewheel diode chip. As FIG. 9 shows, it is preferable to use several chip supports and to arrange several transistors and freewheel diodes on each chip support. Additional chip supports are shown in FIG. 9 by broken lines in the form of blocks.

Above the chips 84 and 86, there is a circuit board 100 mounted on supports 98. This circuit board is provided with holes 102, 104, 106, 108, 110, the diameter of which is large in comparison with the diameter of the bond wires 88 to 96. Terminal pins 112, 114, 116, 118, 119 are provided alongside the holes 102 to 110 respectively. Discreet soldering points can be provided on the underside of the circuit board 100 for attaching the terminal pins.

Figure 14:
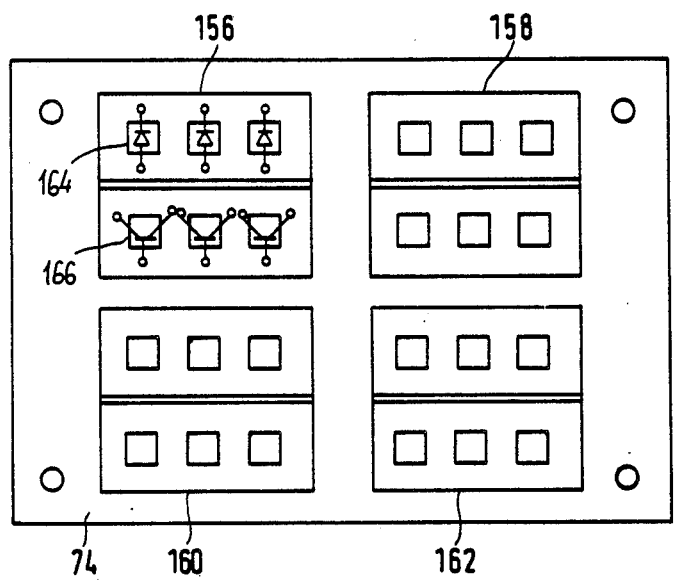
FIG. 14 shows an arrangement of the semiconductor switching elements and the freewheel diodes in a multiple module for an inverter according to FIGS. 11 and 12.

As is shown schematically in FIG. 9, a number of the chip supports 76 can be arranged alongside each other, the chip supports 76 in FIG. 9 each being shown after having been turned through 90° with respect to their position in FIG. 8. An additional chip support arrangement is shown in FIG. 14, which is described hereinafter.

After the bond wires have been connected to the chips 84 and 86 the wires are directed vertically upwards. It is then easy, even in the case of a large number of bond wires, to pass these through the relatively large holes 102 to 110 when mounting the circuit board 100. After the circuit board 100 has been mounted, the bond wires are conductively connected with the terminal pins in known manner. It is advisable that the bond wires are connected to the terminal pins in such a way that compensation of thermally induced length alterations is possible. After the connection is established with the connecting pins, the chips beneath the circuit board 100 can be protected by clearing the gap between the circuit board 100 and the thermal sink plate 74.

It is advisable that the terminal pins 112 for the bases B of the transistors 84 be shorter in design than the remaining terminal pins. Conductor strips 120 can be provided at the underside of the circuit board 100, as shown in FIG. 9, to which the base terminals of the transistors 84 are connected, preferably via series resistors 122, which are soldered at the same time as the contact pins. The soldering point for the terminal pin 112 can be therefore designed simultaneously as the connection of the series resistor 122. It is advisable that a conductor strip be provided for each basic module, so that the basic module can be controlled separately.

In the case of the circuit to be described further hereinafter, for an inverter, basic modules with transistors and freewheel diodes are required in which the freewheel diodes are connected to the common load point by the anode on the one hand and by the cathode on the other hand. In this case, the multiple module according to FIGS. 8 and 9 is preferably provided with four basic modules, which is to say two in which the freewheel diodes are connected to the load point by the anode and two in which the freewheel diodes are connected by the cathode. If a number of transistors and freewheel diode chips are arranged on one chip support, a number of bond wires of parallel poles can also be guided to one terminal pin.

A multiple module according to FIGS. 8 and 9 having a number of basic modules can be interconnected via a circuit board designed for the respective purpose. Such a circuit board, as is shown in FIGS. 8 and 9, is preferably designed in the form of a multilayer circuit board 124. This board is provided with three thick-layer conductor layers 126, 128, 130, and with bores 132 according to the pattern of the terminal pins 114 to 119 of the multiple module. These bores 132 are each provided with a connection to the desired conductor layer 126, 128 or 130. In the case of the embodiment shown, the conductor in the conductor layer 126 is the load connection, the conductor in the conductor layer 128 is the positive pole and the conductor in the conductor layer 130 is the negative pole. The conductors in the conductor layers 128, 130 can be provided respectively at their ends with connections 134, 136 for the direct current voltage connection, while the conductor in the conductor layer 126 is provided with a load connection 138. Connections for the smoothing capacitors 140, 142 can be provided at the ends of the conductor layers 128, 130. Parallel conductor strips can also be designed in the individual condctor layers.

As is clear from the foregoing, multiple modules, as described hereinbefore, can be interconnected in various ways where this interconnetion takes place exclusively via the circuit board 124. This circuit board can easily be clipped onto the terminal pins of the multiple module. The terminal pins need then only be soldered in the bores. The circuit board 124 results in an extremely low-inductance switching circuit like the conductor design according to FIGS. 2 to 6, and that even then, if the conductor layer or plate 126 forming the load connection is arranged at greater distance to or in another position relative to the conductor layers 128 and 130.

The multiple module described above is in a special way also suitable for bridge connections, as are used for example in inverters.

Figure 10:
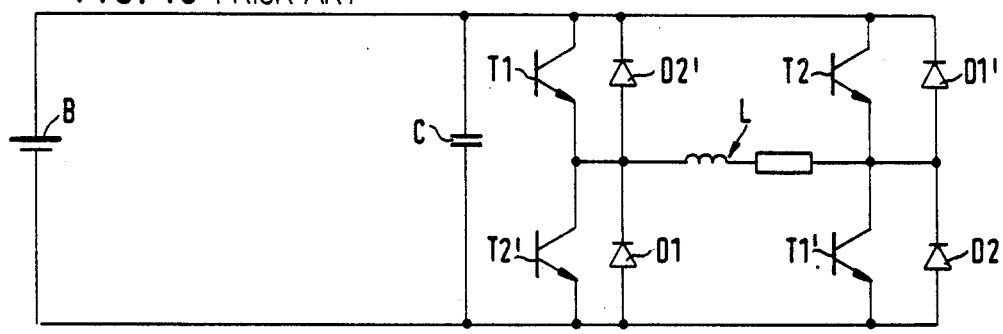
FIG. 10 shows a known inverter circuit.

A known inverter circuit is shown in FIG. 10. It comprises four semiconductor switching elements, in this case transistors T1, T1', T2 and T2' and four freewheel diodes D1, D1', D2 and D2'. The load L is represented as an ohmic-inductive load. It could for example be a transformer. The inverter is fed by a direct current voltage source B and features a smoothing capacitor C connected between the feed lines.

In the operation of the inverter, the transistors T1 and T1', for example, are controlled via a control, which is not shown, at the beginning of a half wave. The current then flows from the voltage source B across transistor T1 to the load L and across transistor T1' back to the voltage source. After the transistors T1, T1' are switched off, the current is further sustained by the magnetic energy stored in the inductance of the load and flows across the freewheel diodes D1 and D1' back to the voltage source. The transistors T2 and T2' are conductively controlled at the same time, with the result that the current is reversed in the load after its decay and then flows during the second half wave from the battery across the transistors T2 and T2'. When this half wave is completed the same process is repeated. The transistors T2 and T2' are switched off again, the current flows in the same direction across the freewheel diodes D2 and D2' back to the voltage source until the current flows again across transistors T1 and T1' after they have been switched on. In this case current flows through neighbouring transistors and freewheel diodes with the same load and direct current voltage connection in opposite directions.

The same problem as that described hereinbefore for the chopper circuit occurs with regard to the commutating of the load current from the transistor arms into the freewheel diode arms. Even in the case of the bridge connection according to FIG. 10, the current flows through different spatial conductor loops in opposite directions, which in the commutating process can produce considerable peak voltages in the commutating circuit which would damage the transistors. By means of the smoothing capacitor C, only the effect of the inductance of the feed loop from the direct current voltage source up to the inverter can be eliminated.

Figure 11:
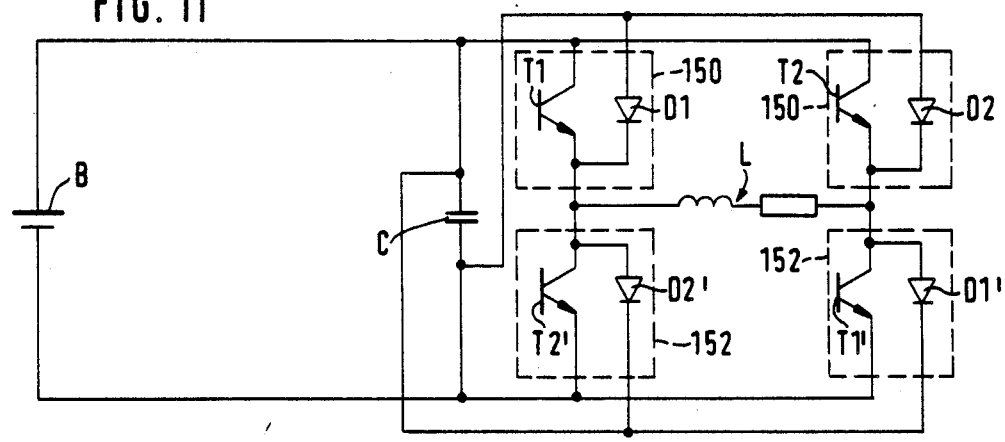
FIG. 11 shows an inverter circuit according to the invention.

In the case of the bridge connection according to FIG. 11, designed according to the invention, the freewheel diodes are co-ordinated in relation to the transistors in such a way that current flows through both in the same direction, in contrast to the circuit according to FIG. 10 in which current flows through the neighbouring transistors and freewheel diodes in opposite directions. In the case of this arrangement, there are therefore no longer any conductor loops through which the current flows in alternate directions, as in the case of the embodiment according to FIG. 10. A very low parasitic inductance is achieved for the circuit as a result of the fact that the current flows in the same direction in conjunction with the close alignment of the conductors which is described here as above with reference to FIGS. 1 to 9. The close conductor guide needs here only be continued to the smoothing capacitor C if this is of low resistance. A multiple module according to the invention is therefore a particularly practicable way of realizing this circuit.

Figure 12:
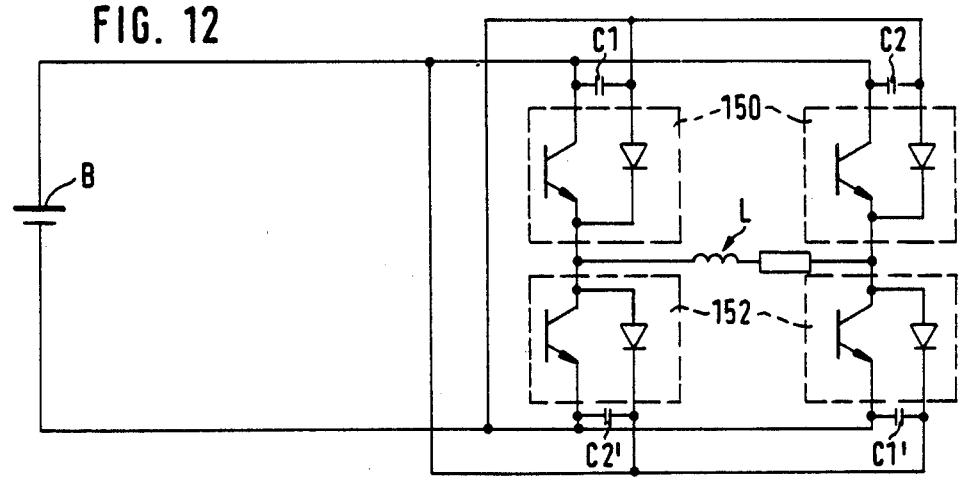
FIG. 12 shows a further configuration of the inverter design according to FIG. 11.

A further reduction of the inconvenient parasitic inductance is achieved, as shown in FIG. 12, by dividing the smoothing capacitor into four partial capacitors $C_1$, $C_2$, $C_{2'}$ and $C_{1'}$, which are arranged respectively in direct proximity to the basic modules 150, 152. Only that conductor loop comprising transistor, freewheel diode and capacitor is inconvenient in the sense of the appearance of parasitic inductance and this can be made sufficiently small by the multiple module design described. The basic modules 150 and 152 shown in FIGS. 11 and 12 preferably feature a number of parallel transistors and freewheel diodes designed in this way.

Figure 13:
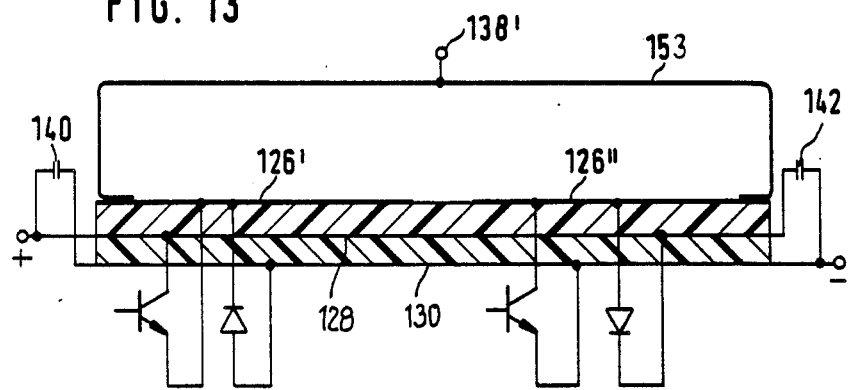
FIG. 13 shows a design of the multiple module for an inverter according to FIGS. 11 or 12.

In order to avoid a short-circuit current in the case of the circuits according to FIGS. 11 and 12, which occurs if the transistor in one current path is switched off at the same time that the transistor in the other current path is switched on, for example when T1 and T1' are switched off and T2 and T2' are switched on at the same time, it is necessary to provide an inductance between these and the load points of the basic modules 150 and 152. In the case of short switching times of the order of 100 ns and high current intensities, an inductance of a few nH is sufficient. The inductance may, for example, be created by a conductor loop, such as that which is shown in FIG. 13. In this Figure, the multiple module is merely indicated by the two different basic modules and thus by modules in which the freewheel diode is connected to the load point on one hand by its anode and on the other hand by its cathode. The circuit board is again shown schematically with the conductor layers 126, 128, 130. The direct current voltage is connected to the conductor layers, i.e., to the conductor layer 130 by its negative pole and to the conductor layer 128 by its positive pole. The conductor layer 126 for the load connection is here divided into two electrically separate conductor sections 126', 126''. These two conductor sections 126' and 126'' are connected with one another via a conductor loop which is designed by way of example in the form of a sheet metal loop 153. The conductor loop has the load connection 138' in its centre. The inductance of such a loop is sufficient to prevent short circuits during simultaneous switching on and off of the transistors in the basic modules, given the specified conditions. Smoothing capacitors 140, 142 are again connected between the conductor layers 128 and 130 in this case.

A circuit arrangement of a multiple module is shown in principle in FIG. 14. Four basic modules 156, 158, 160, 162 are shown here, each of which features a chip support as was described earlier with reference to FIG. 8. The freewheel diodes 164 and the semiconductor switching elements 166 are soldered respectively on electrically-separate regions of the upper conducting layer of the chip support. Notwithstanding the fact that one of the terminals is the conducting layer of the chip support, the individual poles of the freewheel diodes and of the semiconductor switching elements are each shown schematically. They are connected respectively via bond wires with each other and/or the appropriate terminal pins. As can readily be seen, all four basic modules 156 to 162 are of identical design. They can also be connected in an identical way with terminal pins via their bond wires.

The number of the semiconductor switching elements 166 arranged on each of the chip supports or assigned to the respective basic module provides the current power rating of each of the basic modules 156 to 162. Each of these basic modles can therefore be designed by way of example for a current intensity of 30 A. Then a total current intensity of 120 A can be switched with a multiple module, as is shown in FIG. 14, in view of the parallel connection of all the basic modules. Should two basic modules each be connected in parallel then an inverted circuit according to FIGS. 11 or 12 of the type of a half-bridge can be realized for a current intensity of 60 A with two such multiple modules. But with the four basic modules, a complete bridge circuit can also be realized for 30 A, the load connections being guided on four sections of the conductor layer 126 which are then connecterd respectively with one another in pairs across an inductive conductor loop according to FIG. 13, the centre of which then gives one of the load connection points. There need only be a single smoothing capacitor on the semiconductor module for the entire circuit. It is however advisable, with a view to further reduction of the parasitic inductance, to provide two capacitors, as shown in FIG. 13, which can again be provided in the most direct proximity to the basic modules 156, 160 and 158, 162 and which are then effective both during the positive and the negative half wave.

Using the high attainable switching frequency of 20 kHz and more, sinusoidal output voltages can be produced with an inverter of the type described in conjunction with pulse width modulation. It is therefore at the same time possible, through the high number of turn-ons during a half wave, generally to compensate voltage drops within a half wave and therefore to achieve a sinusoidal output voltage of high constancy. Rapid-switch bipolar transistors may be used as semiconducor switches. Of particular advantage is the use of MOS-FET's, but GTO's can also find application as switching elements.

What I claim as my invention and desire to secure by Letters Patent of the United States is:

1. A semiconductor module for a high-speed power switching arrangement, the module comprising an active semiconductor switching elements and a freewheel diode each having first and second terminals, said first terminal of said semiconductor switching element and said first terminal of said freewheel diode being connected to each other and constituting a common terminal for connection to a load, a pair of conductor layers each connected to a respective one of said second terminals of said semiconductor switching element and said freewheel diode and each adapted to be connected to a respective one of the terminals of a direct current voltage source, said semiconductor switching element and said freewheel diode each being disposed in direct proximity to each other and to said pair of conductor layers, and an insulating layer between said conductor layers such that said conductor layers are disposed geometrically parallel and in direct proximity to each other, whereby upon said common terminal of said semiconductor switching element and said freewheel diode being connected to a load and therethrough to one of the terminals of a direct current voltage source and upon said conductor layers being connected to respective terminals of said direct current voltage source, current flows relative to said common terminal in the same direction through said pair of conductor layers toward said semiconductor switching element and said freewheel diode, respectively.

2. A semiconductor module according to claim 1, in which a plurality of semiconductor switching elements and freewheel diodes are provided in sets each comprising a semiconductor switching element and a freewheel diode, with each semiconductor element and its associated freewheel diode being arranged directly alongside each other, and in which said conductor layers extend across said sets of semiconductor switching elements and freewheel diodes in direct proximity thereto.

3. A semiconductor module according to claim 1, in which said conductor layers are formed of metal sheets.

4. A semicondctor module according to claim 1, in which a multilayer circuit board is provided, and the insulating layer between said conductor layers is constituted by one layer of the multilayer circuit board.

5. A semiconductor module according to claim 2, in which said conductor layers are formed of metal sheets.

6. A semiconductor module according to claim 2, in which a multilayer circuit board is provided, and the insulating layer between said conductor layers is constituted by one layer of the multilayer circuit board.

7. A semiconductor module according to claim 1, in which said conductor layers are provided with connecting elements for connection of a smoothing capacitor thereto.

8. A semiconductor module according to claim 1, in which said conductor layers are provided in respective central regions thereof with mutually overlying elongated apertures, and connecting elements protrude from at least the edges of said conductor layers defining the boundaries of said apertures.

9. A semiconductor module according to claim 1, in which a plurality of semiconductor switching elements and freewheel diodes are provided in sets each comprising a semiconductor switching element and a freewheel diode, with each semiconductor switching element and its associated freewheel diode being arranged directly alongside each other, and in which at least one electrically insulating substrate plate is provided, said sets of semiconductor switching elements and freewheel diodes being arranged on said at least one electrically insulating subtrate plate.

10. A semiconductor module according to claim 9, in which said at least one substrate plate is provided on both faces thereof with a metallic coating and is arranged in contact with a thermal sink.

11. A semiconductor module according to claim 10, in which a plurality of said substrate plates are arranged in contact with a common thermal sink.

12. A semiconductor module according to claim 9, in which rigid connecting elements are provided, said semiconductor switching elements and said freewheel diodes having respective bond wires connected conductively to associated ones of said rigid connecting elements.

13. A semiconductor module according to claim 9, in which an insulating contact carrier plate extends over said sets of semiconductor switching elements and freewheel diodes, and terminal pins are mounted in said contact carrier plate.

14. A semiconductor module according to claim 13, in which openings are provided in said contact carrier plate, and bond wires of said semiconductor switching elements and said freewheel diodes extend through said openings, said openings having cross-sections which are large in comparison to the cross-sections of said bond wires.

15. A semiconductor module according to claim 12, in which a circuit board is provided, and holes are provided in said circuit board, said rigid connecting elements being received in said holes, and said holes being each connected conductively with a respective one of said conductor layers.

16. A semiconductor module according to claim 15, in which a third conductor layer is provided on said circuit board to constitute the load connection.

17. A semiconductor module according to claim 9, in which said semiconductor switching element and its associated freewheel diode in each set are connected in parallel, and in which in one half of said sets of semiconductor switching elements and freewheel diodes the cathode of each freewheel diode is connected to a first load point, while in the other half of said sets of semiconductor switching elements and freewheel diodes the anode of each freewheel diode is connected to a second load point, said two load points being connected via an inductance with a common load connection.

18. A semiconductor module according to claim 17, in which said inductance has the form of a conductor loop to which said common load connection is connected symmetrically.

19. A semiconductor module according to claim 1, in which said pair of conductor layers are superjacent one another.

20. A semiconductor module according to claim 2, in which said pair of conductor layers are superjacent one another.

* * * * *